(12) United States Patent
Kawasaki

(10) Patent No.: US 11,700,491 B2
(45) Date of Patent: Jul. 11, 2023

(54) ACOUSTIC WAVE DEVICE AND ACOUSTIC WAVE MODULE INCLUDING SAME

(71) Applicant: Murata Manufacturing Co., Ltd., Nagaokakyo (JP)

(72) Inventor: Koichiro Kawasaki, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 17/980,614

(22) Filed: Nov. 4, 2022

(65) Prior Publication Data

US 2023/0056515 A1    Feb. 23, 2023

Related U.S. Application Data

(63) Continuation of application No. 17/458,617, filed on Aug. 27, 2021, now Pat. No. 11,523,223, which is a (Continued)

(30) Foreign Application Priority Data

Aug. 31, 2017    (JP) ................. 2017-166612

(51) Int. Cl.
*H04R 25/00*   (2006.01)
*H04R 17/00*   (2006.01)
(Continued)

(52) U.S. Cl.
CPC ............ *H04R 17/00* (2013.01); *H04R 1/025* (2013.01); *H04R 7/04* (2013.01); *H04R 2400/11* (2013.01)

(58) Field of Classification Search
CPC ... H04R 7/24; H04R 7/04; H04R 7/18; H04R 19/04; H04R 17/00; H04R 9/047; H04R 7/06; H04R 19/005; H04R 2201/003
See application file for complete search history.

(56) References Cited

U.S. PATENT DOCUMENTS 9,693,149 B2 *   6/2017   Yoo .................. H04R 17/02
2017/0162518 A1   6/2017   Liao et al.

FOREIGN PATENT DOCUMENTS

CN    106847761 A    6/2017

OTHER PUBLICATIONS

Kawasaki, "Acoustic Wave Device and Acoustic Wave Module Including Same", U.S. Appl. No. 17/458,617, filed Aug. 27, 2021.
(Continued)

*Primary Examiner* — Amir H Etesam
(74) *Attorney, Agent, or Firm* — Keating & Bennett, LLP

(57) ABSTRACT

An acoustic wave device includes a substrate, functional elements on a first main surface of the substrate, an outer support portion on the substrate around a region where the functional elements are disposed, a cover portion opposed to the first main surface of the substrate with the outer support portion interposed therebetween, a support portion in a hollow space defined by the substrate, the outer support portion, and the cover portion, a wiring pattern electrically connected to the functional elements, and a through electrode extending through the substrate and electrically connected to the wiring pattern. A gap is provided between the support portion and the cover portion. A distance from the first main surface of the substrate to an upper surface of the support portion is greater than a distance from the first main surface of the substrate to an upper surface of the functional elements.

20 Claims, 3 Drawing Sheets

Related U.S. Application Data continuation of application No. 16/789,461, filed on Feb. 13, 2020, now Pat. No. 11,134,344, which is a continuation of application No. PCT/JP2018/028220, filed on Jul. 27, 2018.

(51) Int. Cl.
*H04R 1/02* (2006.01)
*H04R 7/04* (2006.01)

(56) References Cited

OTHER PUBLICATIONS

First Office Action in CN201880055923.3, dated Jan. 19, 2023, 6 pages.

\* cited by examiner

ACOUSTIC WAVE DEVICE AND ACOUSTIC WAVE MODULE INCLUDING SAME

CROSS REFERENCE TO RELATED APPLICATIONS

This application claims the benefit of priority to Japanese Patent Application No. 2017-166612 filed on Aug. 31, 2017 and is a Continuation Application of PCT Application No. PCT/JP2018/028220 filed on Jul. 27, 2018. The entire contents of each application are hereby incorporated herein by reference.

BACKGROUND OF THE INVENTION

1. Field of the Invention

The present invention relates to an acoustic wave device and an acoustic wave module including the same, and more specifically, to a package structure that reduces local heat in an acoustic wave device.

2. Description of the Related Art

Acoustic wave devices using surface-acoustic-wave (SAW) resonators or bulk-acoustic-wave (BAW) resonators are used in electronic apparatuses, such as cellular phones or smartphones. In recent years, the electronic apparatuses have become increasingly smaller and thinner, and thus, miniaturization and profile reduction of the acoustic wave devices themselves have also been required. To this end, wafer level package (WLP) structures that use chips themselves of the acoustic wave devices as packages have been proposed.

A typical acoustic wave device having a WLP structure has a configuration in which a plurality of functional elements are arranged on a piezoelectric substrate in a hollow space defined by the piezoelectric substrate, a support layer arranged around a surface of the piezoelectric substrate, and a cover portion provided on the support layer. In the case of a surface-acoustic-wave (SAW) device, comb-shaped electrodes (interdigital transducer (IDT)) are arranged as the functional elements.

A process for manufacturing the acoustic wave device may include a step for sealing a module including the acoustic wave device with resin in order to protect the device. In such a sealing step, a pressure may be applied to the acoustic wave device, and this may cause deformation of the cover portion defining the hollow space. If the cover portion is deformed, it may come into contact with one or more of the functional elements in the hollow space, and they may be broken.

To protect the elements on the piezoelectric substrate from contact caused by the deformation of the cover portion, a technique of providing a support portion as a spacer in the hollow space in the acoustic wave device and, thus, improving the sealing-related handling capability is proposed. One such example technique is disclosed in, for example, Japanese Unexamined Patent Application Publication No. 2017-118368.

In the acoustic wave device having the WLP structure disclosed in Japanese Unexamined Patent Application Publication No. 2017-118368, a plurality of partition support layers are provided in a hollow space, the space is divided by the partition support layers into a plurality of sections, and the functional elements are dispersedly arranged in the divided different sections.

The functional elements included in the acoustic wave device may be used with different frequencies or current passing through those functional elements may be different, depending on the functions of the functional elements, their connected positions on a circuit, or the like. Thus, there may be variations in the amounts of heat generated in the functional elements.

In the configuration in which the hollow space is divided into the plurality of sections, as disclosed in Japanese Unexamined Patent Application Publication No. 2017-118368, the amount of heat generated in a specific section may be locally larger than the amounts of heat generated in the other sections, depending on the functional elements arranged in the sections, and this may exert influence on the electric power handling capability.

SUMMARY OF THE INVENTION

Preferred embodiments of the present invention maintain the sealing-related handling capability and reduce the influence of local heat in acoustic wave devices having a WLP structure.

According to a preferred embodiment of the present invention, an acoustic wave device includes a substrate including a first main surface and a second main surface that face each other, a plurality of functional elements on the first main surface of the substrate, an outer support portion on the first main surface of the substrate around a region where the plurality of functional elements are disposed, a cover portion opposed to the first main surface of the substrate with the outer support portion interposed therebetween, a support portion in a hollow space defined by the substrate, the outer support portion, and the cover portion, a signal terminal provided on the second main surface of the substrate, a wiring pattern electrically connected to at least one of the plurality of functional elements, and at least one through electrode extending through the substrate and electrically connected to the wiring pattern. A gap is provided between the support portion and the cover portion. A distance from the first main surface of the substrate to an upper surface of the support portion is greater than a distance from the first main surface of the substrate to an upper surface of the functional elements.

Preferably, the support portion may be made of silicon.
Preferably, the support portion may be on the substrate.
Preferably, the plurality of functional elements may include a first functional element and a second functional element, and the wiring pattern may electrically connect the first functional element and the second functional element. The wiring pattern may define at least a portion of the support portion.
Preferably, at least one of the plurality of functional elements may use bulk waves.
Preferably, the support portion may be located between the first and second functional elements.
Preferably, at least one of the plurality of functional elements may be located between the support portion and the outer support portion.
Preferably, the support portion and the wiring pattern may overlap.
Preferably, a width dimension of the support portion may be smaller than a width dimension of the wiring pattern.
Preferably, the support portion and the at least one through electrode may overlap, and an external terminal provided on the second main surface of the substrate may overlap with the support portion and the at least one through electrode.

Preferably, the wiring pattern electrically may be connected to the at least one through electrode and the outer support portion overlap.

Preferably, the support portion may be located between a transmitting circuit and a receiving circuit.

According to a preferred embodiment of the present invention, an acoustic wave device includes a substrate including a first main surface and a second main surface that face each other, a plurality of functional elements on the first main surface of the substrate, an outer support portion on the first main surface of the substrate around a region where the plurality of functional elements are disposed, a cover portion opposed to the first main surface of the substrate with the outer support portion interposed therebetween, a support portion in a hollow space defined by the substrate, the outer support portion, and the cover portion, a signal terminal provided on the second main surface of the substrate, a wiring pattern electrically connected to at least one of the plurality of functional elements, and at least one through electrode extending through the substrate and electrically connected to the wiring pattern. A gap is provided between the support portion and the cover portion. In a direction extending perpendicular to the first main surface of the substrate, a distance from the cover portion to one of the plurality of functional elements is greater than a distance from the cover portion to the support portion.

According to preferred embodiments of the present invention, acoustic wave devices each having the WLP structure and each including the support portion provided in the hollow space and having the height smaller than that of the outer support layer are able to be provided. Thus, the acoustic wave devices are each able to maintain the sealing-related handling capability and reduce the influence of local heat.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
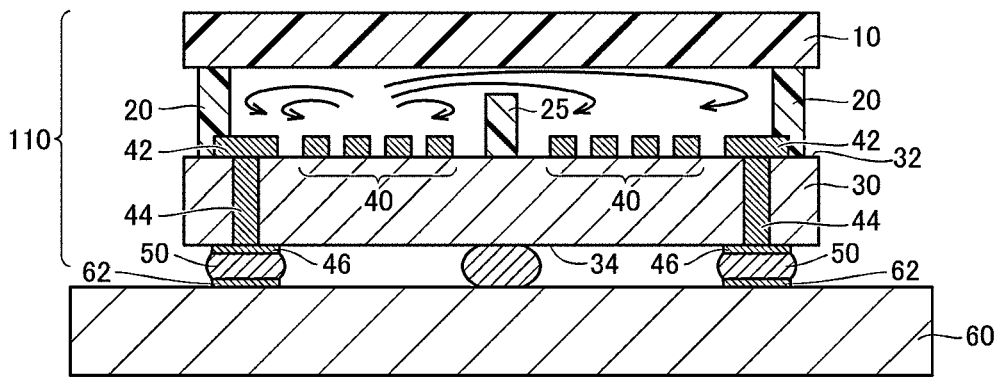
FIG. 1 is a cross-sectional view of an acoustic wave module in which an acoustic wave device according to a first preferred embodiment of the present invention is mounted.

Preferred embodiments of the present invention will be described in detail below with reference to the drawings. The same or corresponding portions in the drawings have the same reference numerals, and the description thereof is not repeated.

First Preferred Embodiment

FIG. 1 is a cross-sectional view of an acoustic wave module 100 in which an acoustic wave device 110 according to a first preferred embodiment of the present invention is mounted on a mounting substrate 60. The acoustic wave device in the present preferred embodiment is described as a surface-acoustic-wave device including IDT electrodes as functional elements, as an example. The acoustic wave device may use bulk waves, for example.

Referring to FIG. 1, the acoustic wave device 110 includes a cover portion 10, an outer support layer 20, a piezoelectric substrate 30, functional elements 40, and terminal electrodes 50.

An example of the piezoelectric substrate 30 may preferably be made of, for example, a piezoelectric monocrystalline material, such as lithium tantalate ($LiTaO_3$), lithium niobate ($LiNbO_3$), aluminum oxide, silicon (Si), or sapphire, or a piezoelectric multilayer material including $LiTaO_3$ or $LiNbO_3$. The plurality of functional elements 40 are provided on a first surface 32 of the piezoelectric substrate 30. The functional elements 40 may preferably include a pair of IDT electrodes made by, for example, using an electrode material of an elemental metal of at least one of aluminum, copper, silver, gold, titanium, tungsten, platinum, chromium, nickel, and molybdenum or of an alloy mainly including any of the above-described metals. The piezoelectric substrate 30 and IDT electrodes define a surface-acoustic-wave resonator.

The outer support layer 20 preferably made of resin, for example, is disposed on a portion extending along the outer area of the first surface 32 of the piezoelectric substrate 30. The cover portion 10 is opposed to the first surface 32, on which the functional elements 40 are provided, with the outer support layer 20 interposed therebetween, and thus a hollow space is provided around the plurality of functional elements 40, which include the IDT electrodes. In this configuration, surface acoustic waves propagate in a portion of the piezoelectric substrate 30 adjacent to that hollow space.

A wiring pattern 42 to electrically connect the functional elements 40 is provided on the first surface 32 of the piezoelectric substrate 30. The wiring pattern 42 is electrically connected to metal pads 46 on a second surface 34, which is opposite to the first surface 32, of the piezoelectric substrate 30, with through electrodes 44 interposed therebetween. The through electrodes 44 extend through the piezoelectric substrate 30. The metal pads 46 are electrically connected to a wiring pattern 62 on the mounting substrate 60 with the terminal electrodes 50, such as solder bumps, for example, interposed therebetween.

At least one support portion 25 preferably made of resin is provided on the first surface 32 of the piezoelectric substrate 30 inside the hollow space. The support portion 25 is used to prevent breakage of the functional elements 40 caused by contact between the cover portion 10 and functional elements 40 when the cover portion 10 is deformed by a pressure applied from the outside to the cover portion 10 in a manufacturing step. The support portion 25 divides the hollow space into a plurality of sections. The functional elements 40 are dispersedly disposed in the plurality of divided sections.

When a dimension in a direction from the piezoelectric substrate 30 toward the cover portion 10 is expressed as "height," the height of the support portion 25 in the first preferred embodiment is designed to be smaller than the height of the outer support layer 20 and larger than the height of each of the functional elements 40. That is, in the acoustic wave device 110 in the first preferred embodiment, a gap is provided between the support portion 25 and cover portion 10.

Figure 2:
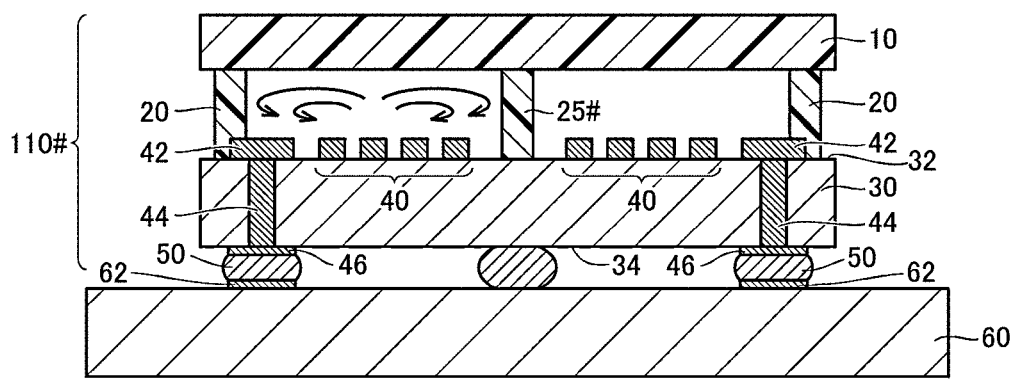
FIG. 2 is a cross-sectional view of an acoustic wave module in which an acoustic wave device according to a comparative example is mounted.

FIG. 2 is a cross-sectional view of an acoustic wave module 100# in which an acoustic wave device 110# according to a comparative example is mounted. The acoustic wave device 110# of the comparative example in FIG. 2 includes the support portion 25 provided in the hollow space in FIG. 1 that is replaced with a support portion 25#. The other portions in the acoustic wave device 110# are the same or substantially the same as those in the acoustic wave device 110 in FIG. 1, and the detailed description thereof is not repeated.

The support portion 25# in the acoustic wave device 110# in FIG. 2 has the same or substantially the same height as that of the outer support layer 20 and is in contact with the cover portion 10 and piezoelectric substrate 30.

When the acoustic wave devices 110 and 110# illustrated in FIGS. 1 and 2 perform their functions, current passes through at least a portion of the functional elements 40, which causes the functional elements 40 to generate heat. At this time, the amounts of heat generated in the functional elements 40 may be different, depending on the types or electrical connected positions of the functional elements 40.

For example, because a transmission circuit needs a large amount of power (current) to transmit radio waves to a predetermined distance, the amount of heat generated in a functional element embedded in the transmission circuit is larger than that in a functional element embedded in a reception circuit. When the functional element embedded in the transmission circuit is connected to a side near a power source (input side), a larger amount of current passes therethrough. Thus, among the plurality of divided sections, the element temperature and substrate temperature tend to easily increase in a section where the functional element through which the larger amount of current passes, in comparison with those in the other sections.

In this case, when the support portion 25# dividing the space into the sections extends from the piezoelectric substrate 30 to the cover portion 10, as illustrated in FIG. 2, gas inside the hollow space warmed by the functional elements 40 and the like remains in the sections, and a high-temperature area may be provided locally in the acoustic wave device. It is generally known that when the temperatures of the functional elements 40 are high, they easily degrade and the like, and the electric power handling capability is weakened. Therefore, for the configuration of the comparative example, the electric power handling capability of the acoustic wave device may be adversely affected by local heat.

In contrast, for the acoustic wave device 110 illustrated in FIG. 1, because a gap is provided between the cover portion 10 and support portion 25, warmed gas easily flows to another section and spreads, and a temperature rise in the section where the functional element 40 generating a larger amount of heat is disposed can be easily mitigated. Accordingly, with the configuration of the support portion 25 in the acoustic wave device 110, the sealing-related handling capability in the manufacturing step can be maintained, and the electric power handling capability of the acoustic wave device 110 can be improved.

Variations of First Preferred Embodiment

In the first preferred embodiment, the support portion 25 is described as being made of resin that is the same as or similar to the outer support layer 20, which supports the cover portion 10. The support portion 25 may have other structures.

Figure 3:
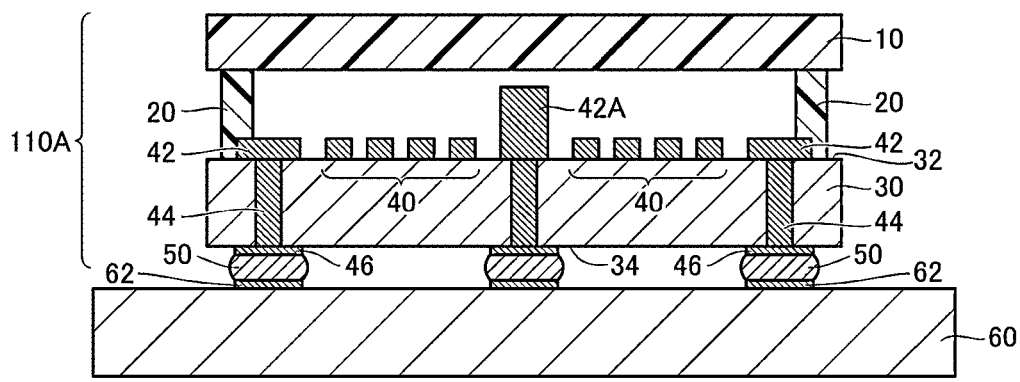
FIG. 3 is a cross-sectional view of an acoustic wave module in which an acoustic wave device according to a variation of the first preferred embodiment of the present invention is mounted.

FIG. 3 discloses, as a variation of the first preferred embodiment, a configuration of an acoustic wave device 110A that provides a wiring pattern 42A electrically connecting the functional elements 40 to define the support portion. The description of the same or substantially the same portions other than the wiring pattern 42A in FIG. 3 as those in FIG. 1 is not repeated.

Referring to FIG. 3, the acoustic wave device 110A includes at least one wiring pattern 42A in the hollow space that has a height that is larger than that of each of the functional elements 40 and at which it is not in contact with the cover portion 10. With that configuration, the cover portion 10 can be supported by the wiring pattern 42A if it is deformed by an external pressure, and gas warmed by heat generated in the functional element 40 can be easily moved to another section.

Figure 4:
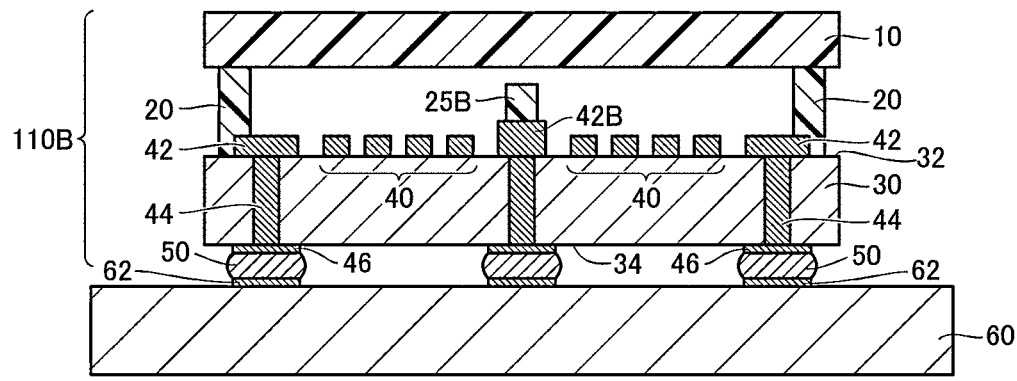
FIG. 4 is a cross-sectional view of an acoustic wave module in which an acoustic wave device according to another variation of the first preferred embodiment of the present invention is mounted.

As illustrated in an acoustic wave device 110B in FIG. 4, a wiring pattern 42B and a support portion 25B made of resin laminated thereon may define and function as the support portion 25 in FIG. 1.

FIGS. 3 and 4 illustrate examples in which the wiring patterns 42A and 42B defining and functioning as the support portion are electrically connected to the mounting substrate 60 with the through electrodes and terminal electrodes interposed therebetween. The wiring patterns 42A and 42B may not be electrically connected to outside the hollow space.

Furthermore, although not illustrated in the drawings, in a single acoustic wave device, the configurations of the support portion illustrated in FIGS. 1, 3, and 4 may be used in any combination as appropriate, depending on the location of the support portion.

Figure 5:
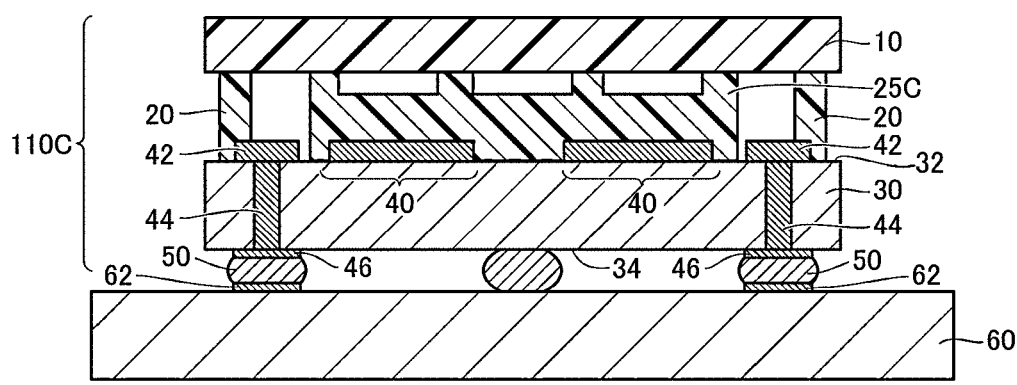
FIG. 5 is a cross-sectional view of an acoustic wave module in which an acoustic wave device according to another variation of the first preferred embodiment of the present invention is mounted.
Figure 6:
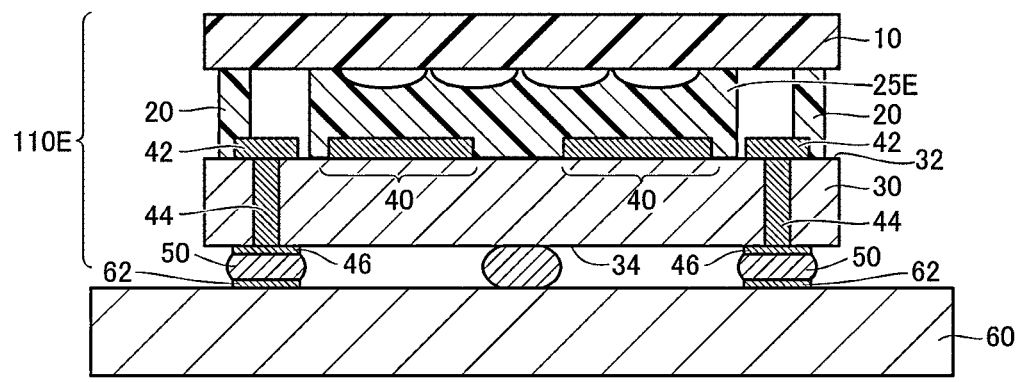
FIG. 6 illustrates a variation of the acoustic wave module in FIG. 5.

The height of the entire support portion need not be smaller than that of the outer support layer. For example, as illustrated in a support portion 25C in FIG. 5 and a support portion 25E in FIG. 6, the support portion may have a height that is smaller than that of the outer support layer in at least a portion thereof. When FIG. 1 is a cross-sectional view of the acoustic wave device seen from the front, FIGS. 5 and 6 correspond to cross-sectional views of the acoustic wave devices seen from a side.

Second Preferred Embodiment

In each of the first preferred embodiment and the variations thereof, the configuration in which the support portion in the hollow space is provided on the piezoelectric substrate 30 is described. In a second preferred embodiment, a configuration in which the support portion is provided on the cover portion 10 is described.

Figure 7:
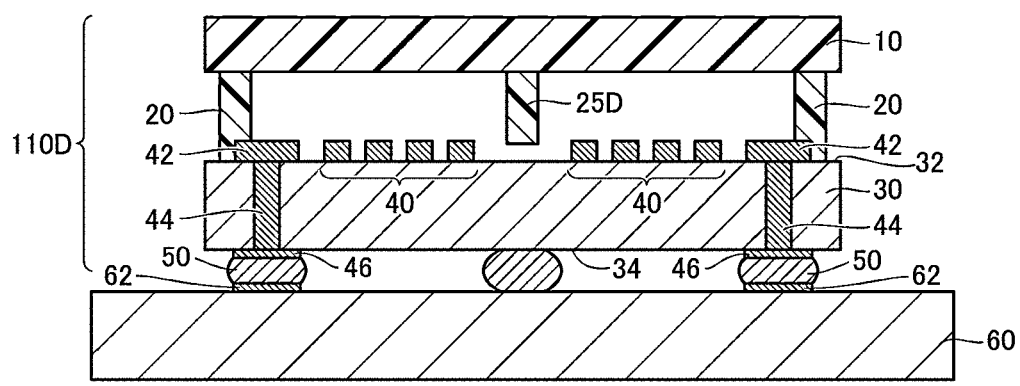
FIG. 7 is a cross-sectional view of an acoustic wave module in which an acoustic wave device according to a second preferred embodiment of the present invention is mounted.

FIG. 7 is a cross-sectional view of an acoustic wave module 100D according to a second preferred embodiment of the present invention in which an acoustic wave device 110D is mounted. In FIG. 7, the support portion 25 in FIG.

1 is replaced with a support portion 25D. The description on the elements in FIG. 7 common to those in FIG. 1 is not repeated.

Referring to FIG. 7, in the acoustic wave module 100D, the support portion 25D preferably made of resin, for example, is provided on the cover portion 10 and divides the hollow space into the plurality of sections. The height of the support portion 25D is smaller than that of the outer support layer 20 and larger than that of each of the functional elements 40. Thus, a gap is provided between the support portion 25D and piezoelectric substrate 30. In this configuration, even if the cover portion 10 is deformed by an external pressure, the cover portion 10 is supported by the support portion 25D before the cover portion 10 comes into contact with the functional elements 40. Thus, breakage of the functional elements 40 caused by the cover portion 10 can be reduced or prevented.

Gas warmed by heat generated in the functional elements 40 can be moved to other sections through the gap between the support portion 25D and piezoelectric substrate 30. Therefore, local heating state can be reduced or prevented, and this results in improved electric power handling capability.

In the second preferred embodiment, the support portion may also have the configurations of the variations of the first preferred embodiment.

As described above, in the present preferred embodiment, the acoustic wave device having the WLP structure includes the support portion provided in the hollow space and having the height smaller than that of the outer support layer and larger than that of each of the functional elements. Thus, because the gap is provided between the support portion and cover portion or between the support portion and piezoelectric substrate, gas warmed in a section with a large amount of heat generated can be easily moved to other sections. Even if the cover portion is deformed by an external pressure in a sealing step, contact between the cover portion and functional elements can be reduced or prevented by the support portion. Consequently, the acoustic wave devices according to preferred embodiments of the present invention can both achieve the sealing-related handling capability and reduce the influence of local heat.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave device comprising:
   a substrate including a first main surface and a second main surface that face each other;
   a plurality of functional elements on the first main surface of the substrate;
   an outer support portion on the first main surface of the substrate around a region where the plurality of functional elements are disposed;
   a cover portion opposed to the first main surface of the substrate with the outer support portion interposed therebetween;
   a support portion in a hollow space defined by the substrate, the outer support portion, and the cover portion;
   a signal terminal provided on the second main surface of the substrate;
   a wiring pattern electrically connected to at least one of the plurality of functional elements; and
   at least one through electrode extending through the substrate and electrically connected to the wiring pattern; wherein
   a gap is provided between the support portion and the cover portion; and
   a distance from the first main surface of the substrate to an upper surface of the support portion is greater than a distance from the first main surface of the substrate to an upper surface of the functional elements.

2. The acoustic wave device according to claim 1, wherein the substrate is made of silicon.

3. The acoustic wave device according to claim 2, wherein the support portion is on the substrate.

4. The acoustic wave device according to claim 3, wherein the plurality of functional elements include a first functional element and a second functional element;
   the wiring pattern electrically connects the first functional element and the second functional element; and
   the wiring pattern defines at least a portion of the support portion.

5. The acoustic wave device according to claim 4, wherein at least one of the plurality of functional elements uses bulk waves.

6. The acoustic wave device according to claim 5, wherein the support portion is located between the first and second functional elements.

7. The acoustic wave device according to claim 6, wherein at least one of the plurality of functional elements is located between the support portion and the outer support portion.

8. The acoustic wave device according to claim 7, wherein the support portion and the wiring pattern overlap.

9. The acoustic wave device according to claim 8, wherein a width dimension of the support portion is smaller than a width dimension of the wiring pattern.

10. The acoustic wave device according to claim 9, wherein
    the support portion and the at least one through electrode overlap; and
    an external terminal provided on the second main surface of the substrate overlaps with the support portion and the at least one through electrode.

11. The acoustic wave device according to claim 3, wherein
    the wiring pattern electrically connected to the at least one through electrode and the outer support portion overlap.

12. The acoustic wave device according to claim 10, wherein the support portion is located between a transmitting circuit and a receiving circuit.

13. An acoustic wave device comprising:
    a substrate including a first main surface and a second main surface that face each other;
    a plurality of functional elements on the first main surface of the substrate;
    an outer support portion on the first main surface of the substrate around a region where the plurality of functional elements are disposed;
    a cover portion opposed to the first main surface of the substrate with the outer support portion interposed therebetween;
    a support portion in a hollow space defined by the substrate, the outer support portion, and the cover portion;
    a signal terminal provided on the second main surface of the substrate;
    a wiring pattern electrically connected to at least one of the plurality of functional elements; and at least one through electrode extending through the substrate and electrically connected to the wiring pattern; wherein a gap is provided between the support portion and the cover portion; and in a direction extending perpendicular to the first main surface of the substrate, a distance from the cover portion to one of the plurality of functional elements is greater than a distance from the cover portion to the support portion.

14. The acoustic wave device according to claim 13, wherein the support portion is on the substrate.

15. The acoustic wave device according to claim 14, wherein the plurality of functional elements include a first functional element and a second functional element;

the wiring pattern electrically connects the first functional element and the second functional element; and the wiring pattern defines at least a portion of the support portion.

16. The acoustic wave device according to claim 15, wherein at least one of the plurality of functional elements uses bulk waves.

17. The acoustic wave device according to claim 16, wherein at least one of the plurality of functional elements is located between the support portion and the outer support portion.

18. The acoustic wave device according to claim 17, wherein the support portion and the wiring pattern overlap.

19. The acoustic wave device according to claim 18, wherein a width dimension of the support portion is smaller than a width dimension of the wiring pattern.

20. The acoustic wave device according to claim 13, wherein the wiring pattern electrically connected to the at least one through electrode and the outer support portion overlap.

* * * * *